US007579690B2

(12) United States Patent
Chia

(10) Patent No.: US 7,579,690 B2
(45) Date of Patent: Aug. 25, 2009

(54) SEMICONDUCTOR PACKAGE STRUCTURE

(75) Inventor: Kan-Jung Chia, Hsin-Chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 0 days.

(21) Appl. No.: 12/197,077

(22) Filed: Aug. 22, 2008

(65) Prior Publication Data
US 2009/0051024 A1    Feb. 26, 2009

(30) Foreign Application Priority Data
Aug. 22, 2007  (TW) .............................. 96131017 A

(51) Int. Cl.
*H01L 23/02* (2006.01)
(52) U.S. Cl. ...................... 257/723; 257/777
(58) Field of Classification Search ................ 257/686, 257/777, 723
See application file for complete search history.

(56) References Cited

U.S. PATENT DOCUMENTS 6,472,736 B1 * 10/2002 Yeh et al. .................... 257/686
6,787,869 B1 *  9/2004 Vittu ............................ 257/434

* cited by examiner

*Primary Examiner*—Roy K Potter
(74) *Attorney, Agent, or Firm*—Schmeiser, Olsen & Watts LLP

(57) ABSTRACT

A semiconductor package structure relates to a chip-embedded semiconductor package electrically connected to a second semiconductor component. The semiconductor package structure comprises a first packaging substrate having a first surface, a second surface and at least a first cavity penetrating through the first surface and the second surface. The semiconductor package structure includes a first semiconductor component with electrode pads disposed in the first cavity. A first build-up circuit structure comprising a plurality of third and fourth conductive pads, and a second semiconductor component with electrode pads is disposed on surfaces of the third conductive pads by a first conductive element. The semiconductor package structure also includes a second conductive element disposed on the fourth conductive pads of the first build-up circuit structure of the first packaging substrate and a stacked structure electrically connecting the stacked structure to the first build-up circuit structure disposed on the first packaging substrate.

20 Claims, 6 Drawing Sheets

SEMICONDUCTOR PACKAGE STRUCTURE

BACKGROUND OF THE INVENTION

1. Field of the Invention

The present invention relates to semiconductor package structures, and more particularly, to a chip-embedded semiconductor package being electrically connected to a second semiconductor component.

2. Description of the Prior Art

Owing to the well-developed semiconductor packaging technology, semiconductor devices nowadays come in a variety of packages. Known methods for packaging semiconductor devices involve mounting an semiconductor component on a packaging substrate or a lead frame, electrically connecting the semiconductor component to the packaging substrate or the lead frame, and encapsulating the packaging substrate with an encapsulant. Known semiconductor packages are typically modularized using multi-chip module (MCM) in order to enhance electrical functions of a semiconductor component, meet the packaging requirements for integration and miniaturization of semiconductor packages, enhance the performance and capacity of a single semiconductor package, and get in line with the trend toward miniaturization, high capacity, and high speed of electronic products. Also, multi-chip modularization downsizes semiconductor packages and enhances electrical functions thereof, and therefore has become a mainstream packaging technology. Multi-chip modularization involves mounting at least two semiconductor chips on a chip carrier of a single package, with each of the two semiconductor chips being stacked on the chip carrier, and the stack type semiconductor package is disclosed in U.S. Pat. No. 6,798,049.

Referring to FIG. 1, which is a cross-sectional view of a semiconductor package disclosed in U.S. Pat. No. 6,798,049, a semiconductor package comprises: a circuit board 10 having at least a surface with a circuit layer 11, the circuit layer 11 is disposed with a plurality of electrically conductive pads 11a and bond pads 11b, wherein an cavity 101 is formed in the circuit board 10; two semiconductor chips 121 and 122 stacked up and disposed in the opening 101; the semiconductor chips 121 and 122 being electrically connected to one another by a bonding layer 13, the semiconductor chip 122 being electrically connected to the bond pads 11b of the circuit layer 11 by conductive components 14, such as a gold wire; an encapsulant 15 for filling the cavity 101 of the circuit board 10 and encapsulating the semiconductor chips 121 and 122 and the conductive elements 14; a solder mask 16 formed on the circuit board 10 and having a plurality of openings 16a formed therein, thereby allowing the electrically conductive pads 11a to be exposed by the openings 16a; and a plurality of conductive elements 17, such as solder balls, being formed at the openings 16a of the solder mask 16 respectively, thereby finalizing the package process.

However, the semiconductor chips 121 and 122 have to be electrically connected to one another by the bonding layer 13 adapted for chip-scale connection; in other words, the semiconductor chips 121 and 122 have to undergo an electrical connection process by stacking in a fab before delivery to a packaging plant for packaging. Hence, the process is intricate and likely to incur fabrication costs.

Electrical functions and effects of modularization are enhanced by chip stacking and yet further enhancement requires additional stacking. Further stacking not only complicates the circuit layer 11 but also increases the required number of the bond pads 11b of the circuit layer 11. Given a limited or invariable available area and with the goal of packaging miniaturization in mind, density of circuits and quantity of the bond pads 11b cannot be increased without using a fine-pitch circuit board in carrying the semiconductor chips 121 and 122.

However, a fine pitch brings insignificant reduction in the area of a circuit board. Also, electrical functions and effect of modularization are enhanced by stacking the two semiconductor chips 121 and 122, but additional enhancement is not feasible due to the fixed number of stacked semiconductor chips.

Accordingly, an issue that faces circuit board manufacturers and calls for immediate solution involves providing a circuit board structure characterized by increased density of multi-chip modules mounted on a multilayer circuit board, reduced area for mounting the semiconductor chips on the multilayer circuit board, and a downsized package with enhanced memory capacity.

SUMMARY OF THE INVENTION

In view of the aforesaid drawbacks of the prior art, it is the primary objective of the present invention to provide a semiconductor package structure which allows a plurality of semiconductor chips to be stacked up so as to enhance electrical functions of the semiconductor package structure.

It is another objective of the present invention to provide a semiconductor package structure conducive, whereby process costs and complexity are reduced.

It is yet another objective of the present invention is to provide a semiconductor package structure on which another electronic device can be stacked so as to enhance electrical functionality and expansibility.

To achieve the above and other objectives, the present invention discloses a semiconductor package structure, comprising: a first packaging substrate having a first surface, a second surface, and at least a first cavity penetrating through the first surface and the second surface, wherein the first surface and the second surface have a plurality of first and second conductive pads, respectively, formed thereon; a first semiconductor component having at least an active surface on which a plurality of first electrode pads are disposed, wherein the first semiconductor component is disposed in the first cavity; a first build-up circuit structure comprising a plurality of third and fourth conductive pads, and a plurality of conductive vias for electrically connecting to the first conductive pads of the first packaging substrate and the first electrode pads of the first semiconductor component, wherein the first build-up circuit structure is disposed on the first surface of the first packaging substrate and the active surface of the first semiconductor component; a second semiconductor component comprising a plurality of electrode pads, wherein the second semiconductor component is disposed on surfaces of the third conductive pads of the first build-up circuit by a plurality of first conductive elements; a plurality of second conductive elements disposed on the fourth conductive pads of the first build-up circuit structure of the first packaging substrate; and a stacked structure comprising a plurality of fifth conductive pads, wherein the fifth conductive pads correspond to the second conductive elements disposed on the surfaces of the fourth conductive pads, so as to electrically connect the stacked structure to the first build-up circuit structure disposed on the first packaging substrate.

The first semiconductor component is a first semiconductor chip and has an active surface and an inactive surface. Alternatively, the first semiconductor component is a semiconductor device and comprises first and second semiconductor chips. The first and second semiconductor chips each have an active surface and an inactive surface. The inactive surfaces of the first and second semiconductor chips are bound together using a binding material. Other first build-up circuit structures are formed on the second surface of the first packaging substrate and the active surface of the second semiconductor chip.

The first and second conductive elements are solder balls. The first build-up circuit structure comprises a dielectric layer, a circuit layer disposed on the dielectric layer, and a plurality of conductive vias formed in the dielectric layer and electrically connected to the circuit layer. The third and fourth conductive pads are electrically connected to the circuit layer. A first insulating protective layer is formed on the build-up circuit structures. A plurality of openings are formed in the first insulating protective layer, so as to allow the third and fourth conductive pads on the first build-up circuit structures to be exposed from the openings. An underfill material is provided between the second semiconductor component and a surface of the first insulating protective layer.

The dielectric layer is also formed on the first surface of the first packaging substrate and the active surface of the first semiconductor component. The dielectric layer is disposed between the first semiconductor component and the first cavity, so as to allow the first semiconductor component to be fixed in position to the first cavity. Alternatively, an adhesive material is provided between the first semiconductor component and the first cavity, so as to allow the first semiconductor component to be fixed in position to the first cavity.

A plurality of second conductive elements, such as solder balls, are formed on the second conductive pads of the first packaging substrate.

The stacked structure is a wire-bonded package structure and comprises a second packaging substrate and a third semiconductor chip mounted thereon. The third semiconductor chip is electrically connected to the second packaging substrate by metal wirings. The third semiconductor chip and the metal wires are encapsulated with an encapsulant. Alternatively, the stacked structure is a chip-embedded package structure and comprises a second packaging substrate with a second cavity formed therein and a third semiconductor chip disposed in the second cavity. A second build-up circuit structure is formed on the second packaging substrate and the third semiconductor chip. The second build-up circuit structure has a plurality of conductive vias formed therein to be electrically connected to the second packaging substrates and third semiconductor chip. Alternatively, the stacked structure is a flip-chip package structure and comprises a second packaging substrate and a third semiconductor chip electrically connected to the second packaging substrate by a flip-chip method. An underfill material is provided between the third semiconductor chip and the second packaging substrate.

The second build-up circuit structure comprises a dielectric layer, a circuit layer disposed on the dielectric layer, and a plurality of conductive vias formed in the dielectric layer and electrically connected to the circuit layer. A plurality of sixth conductive pads are formed on the second build-up circuit structure and electrically connected to the circuit layer. A second insulating protective layer is formed on the second build-up circuit structures. A plurality of openings are formed in the second insulating protective layer, so as to allow the sixth conductive pads on the second build-up circuit structures to be exposed from the openings.

Accordingly, a semiconductor package structure of the present invention has the following essential features. The first semiconductor component is embedded in the first packaging substrate so as to reduce the height of package and stack up other electronic devices, for enhancing electrical functionality and expandability. A second semiconductor component is mounted on the build-up circuit structures, for enhancing electrical functions.

BRIEF DESCRIPTION OF THE DRAWINGS

FIG. 2A' is a cross-sectional view of another embodiment of the method illustrated in FIG. 2A;

FIG. 2B' is a cross-sectional view of another embodiment of the method illustrated in FIG. 2B;

FIG. 2E' is a cross-sectional view of another embodiment of the method illustrated in FIG. 2E;

DETAILED DESCRIPTION OF THE EMBODIMENTS

The present invention is herein illustrated with specific embodiments, so that one skilled in the pertinent art can easily understand other advantages and effects of the present invention from the disclosure of the invention.

FIGS. 2A to 2E are cross-sectional views showing a method for fabricating a semiconductor package structure according to the present invention.

Figure 1:
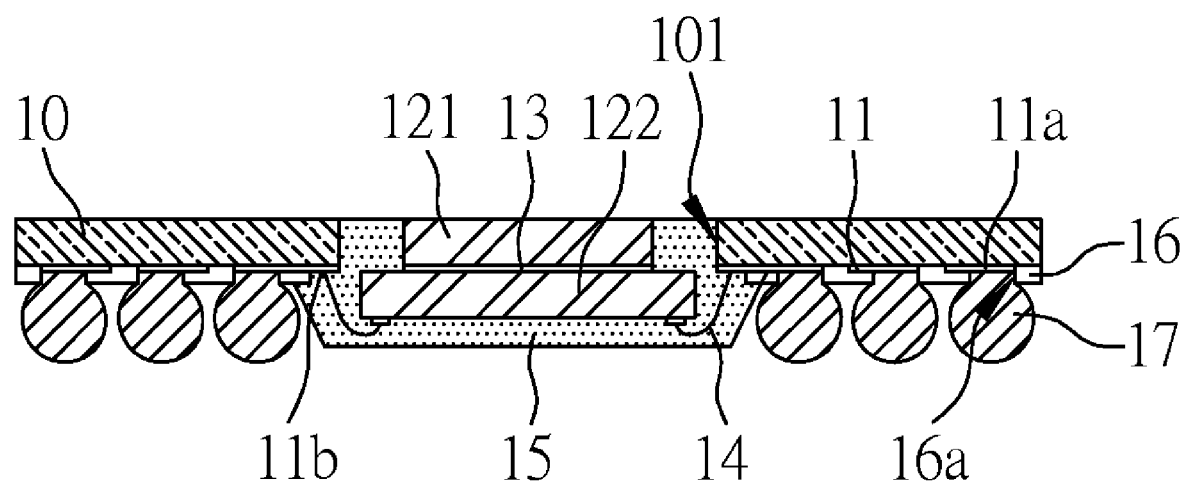
FIG. 1 (PRIOR ART) is a cross-sectional view of a semiconductor package disclosed in U.S. Pat. No. 6,798,049.
Figure 2A:
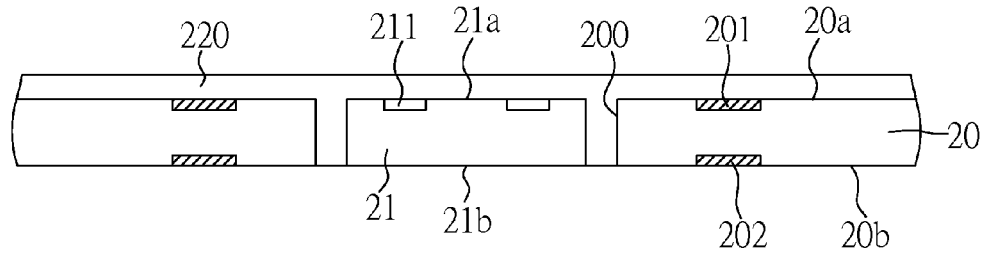
FIGS. 2A to 2E are cross-sectional views showing a method for fabricating a semiconductor package structure according to the present invention.
Figure 2A:
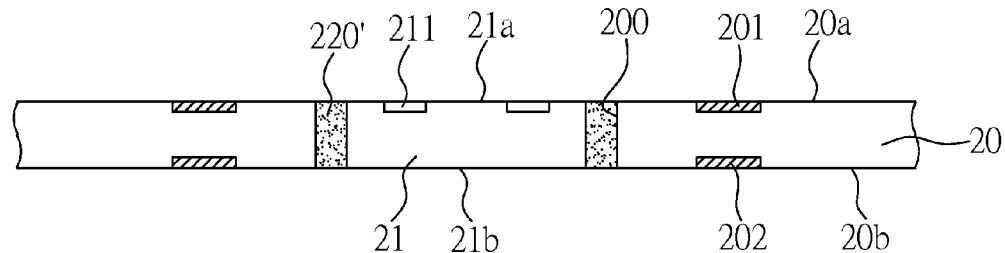

Referring to FIGS. 2A and 2A', a first packaging substrate 20 having a first surface 20a on which a plurality of first conductive pads 201 are formed, an opposing second surface 20b on which a plurality of second conductive pads 202 are formed, and at least a first cavity 200 formed in the first packaging substrate 20 and through the first surface 20a and the second surface 20b. The first and second conductive pads 201, 202 are electrically connected to one another by a circuit layer (not shown) in the first packaging substrate 20. A first semiconductor component, such as a first semiconductor chip 21, is disposed in the first cavity 200. The first semiconductor chip 21 has an active surface 21a and an opposing inactive surface 21b. A plurality of first electrode pads 211 are formed on the active surface 21a. A dielectric layer 220 is formed on the active surface 21a of the first semiconductor chip 21 and the first surface 20a of the first packaging substrate 20. The gap between the first semiconductor chip 21 and the first cavity 200 is filled with the dielectric layer 220, thereby allowing the first semiconductor chip 21 to be fixed in position to the first cavity 200 as shown in FIG. 2A. Alternatively, the gap between the first semiconductor chip 21 and the first cavity 200 is filled with an adhesive material 220', thereby allowing the first semiconductor chip 21 to be fixed in position to the first cavity 200 as shown in FIG. 2A'. The following description is exemplified by the embodiment shown in FIG. 2A.

Figure 2B:
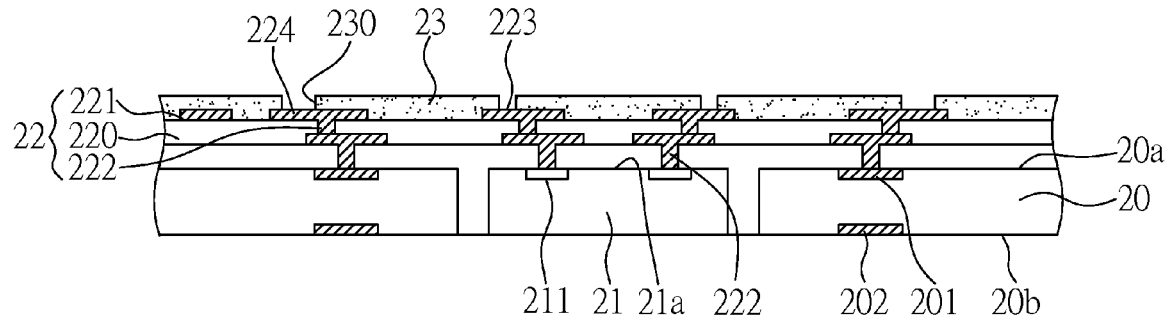
Figure 2B:
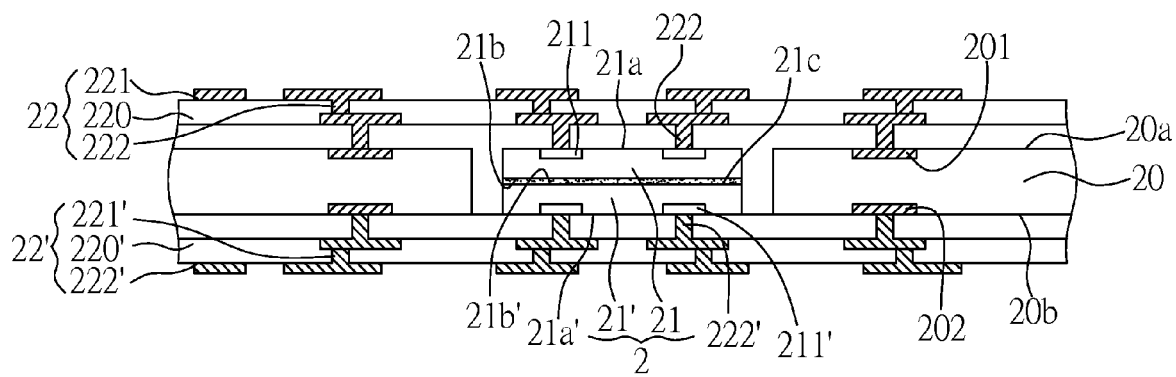

Referring to FIGS. 2B and 2B', at least one first build-up circuit structures 22 each comprises a dielectric layer 220, a circuit layer 221 on the dielectric layer 220, and a plurality of conductive vias 222 formed in the dielectric layer 220 and electrically connected to the circuit layer 221, are formed on the first surface 20a of the first packaging substrate 20 and the active surface 21a of the first semiconductor chip 21. A portion of the conductive vias 222 are electrically connected to the first conductive pads 201 of the first packaging substrate 20 and a portion of the conductive vias 222 are electrically connected to the first electrode pads 211 of the first semiconductor chip 21. A plurality of third and fourth conductive pads 223, 224 electrically connected to the circuit layer 221 are formed on the first build-up circuit structures 22. Also, a first insulating protective layer 23 is formed on the first build-up circuit structures 22, and a plurality of openings 230 are formed in the first insulating protective layer 23, allowing the third and fourth conductive pads 223, 224 on the first build-up circuit structures 22 to be exposed from the openings 230. The third conductive pads 223 are electrically connected to the first electrode pads 211 of the first semiconductor chip 21 via the conductive vias 222 as shown in FIG. 2B. Alternatively, a first semiconductor component, such as a semiconductor device 2, is received in a first cavity 200 of the first packaging substrate 20. The semiconductor device 2 comprises a first semiconductor chip 21 with an inactive surface 21b and a second semiconductor chip 21' with an inactive surface 21b'. The inactive surfaces 21b, 21b' of the first and second semiconductor chips 21, 21' are bound with one another by a binding material 21c, thereby bounding the first and second semiconductor chips 21, 21' together to form the semiconductor device 2. The active surfaces 21a, 21a' of the first and second semiconductor chips 21, 21' are exposed and provided with the first and second electrode pads 211, 211'. At least one first build-up circuit structures 22' are formed on the second surface 20b of the first packaging substrate 20 and the active surface 21a' of the second semiconductor chip 21' of the semiconductor device 2. As a result, the first build-up circuit structures 22, 22' are provided on the first and second surfaces 20a, 20b of the first packaging substrate 20 respectively. The following description is exemplified by the first build-up circuit structures 22 formed on the first surface 20a of the first packaging substrate 20.

Figure 2C:
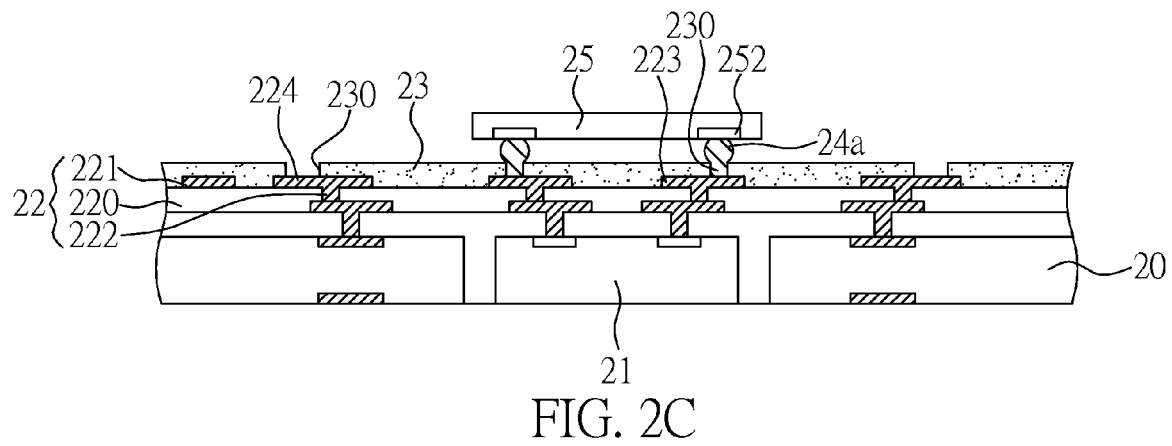

Referring to FIG. 2C, a plurality of first conductive elements 24a in the form of solder bumps are formed on corresponding ones of the third conductive pads 223 on the first build-up circuit structures 22, and a second semiconductor component 25 is mounted on the first conductive elements 24a. The second semiconductor component 25 is provided with a plurality of second electrode pads 252, and the first conductive elements 24a are mounted on the second electrode pads 252, allowing the second semiconductor component 25 to be electrically connected to the first build-up circuit structures 22.

Figure 2D:
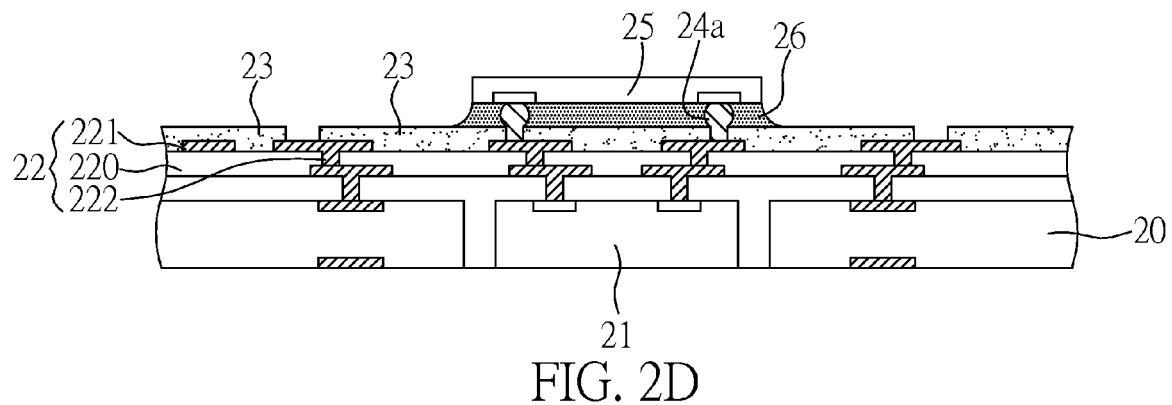

Referring to FIG. 2D, an underfill material 26 is provided between the second semiconductor component 25 and the first insulating protective layer 23 so as to protect the first conductive elements 24a, mitigate the stress between the second semiconductor component 25 and the first packaging substrate 20, and ensure electrical connection between the second semiconductor component 25 and the first packaging substrate 20.

Figure 2E:
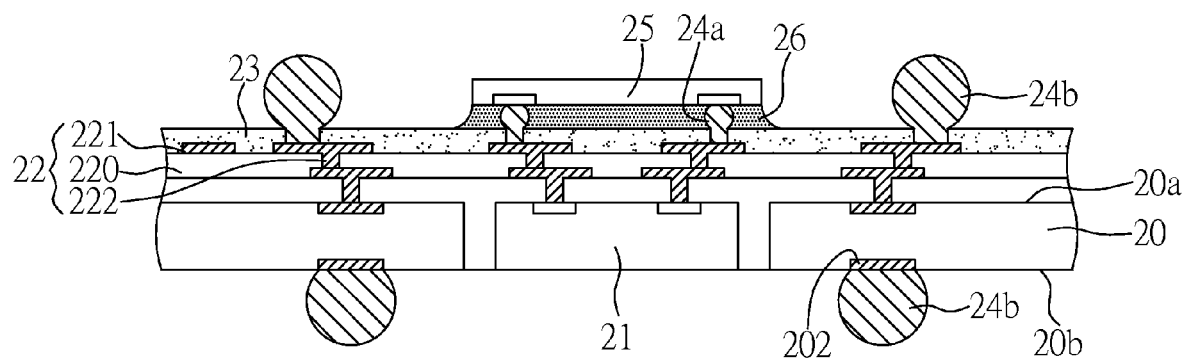
Figure 2E:
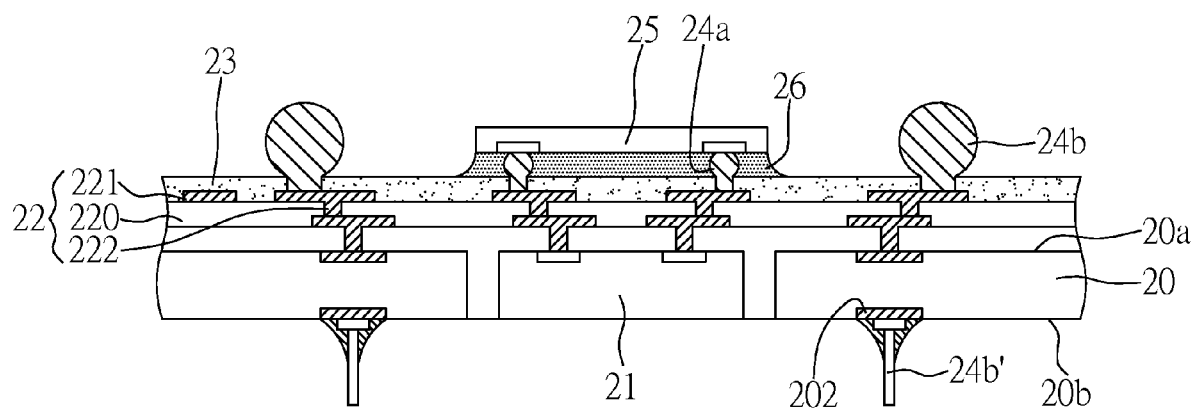

As shown in FIGS. 2E and 2E', a plurality of second conductive elements in the form of solder balls 24b are formed on the second conductive pads 202 of the first packaging substrate 20 and corresponding ones of the fourth conductive pads 224 on the first build-up circuit structures 22 as shown in FIG. 2E. Alternatively, the second conductive elements in the form of pins 24b' are formed on the second conductive pads 202 on the first packaging substrate 20, and the second conductive elements in the form of solder ball 24b are formed on the fourth conductive pads 224 on the first build-up circuit structures 22, as shown in FIG. 2E'. Subsequent embodiment is illustrated with FIG. 2E. The second conductive elements are formed beforehand on the fourth conductive pads 224; alternatively, other electronic device with the second conductive elements formed thereon are mounted on the fourth conductive pads 224.

Figure 3A:
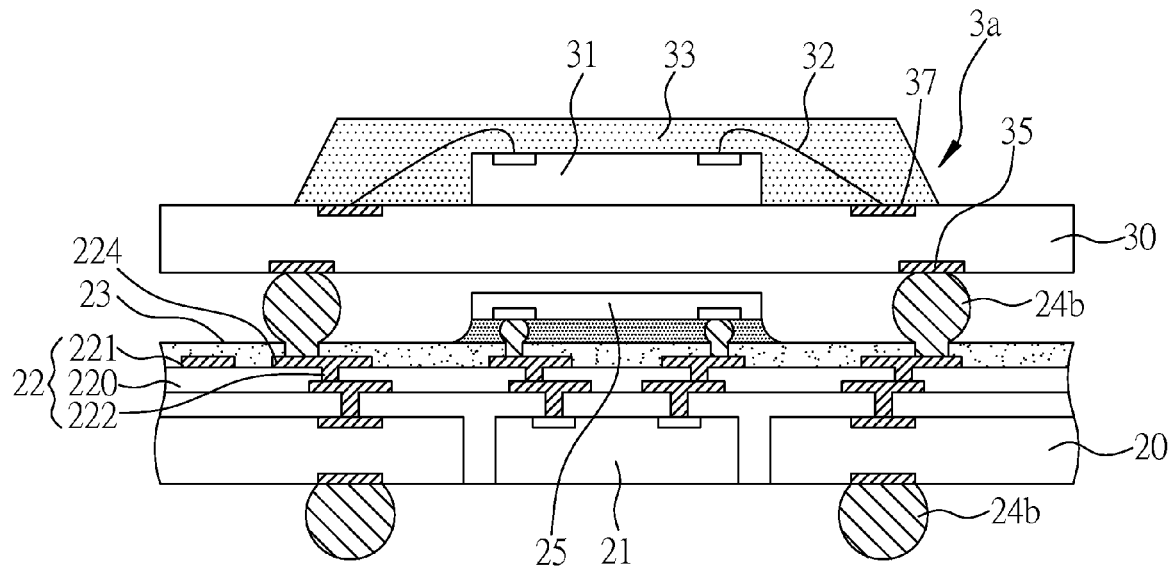
FIG. 3A is a cross-sectional view showing a semiconductor package structure mounted in a stacked structure according to the present invention.

Referring to FIG. 3A, a stacked structure 3a comprises a plurality of fifth conductive pads 35 corresponding in position to the solder balls 24b on the fourth conductive pads 224 provided on the first build-up circuit structures 22, thereby allowing the stacked structure 3a to be electrically connected to the solder balls 24b on the fourth conductive pads 224 provided on the first build-up circuit structures 22, so as to form a stacked package structure. The stacked structure 3a is a wire-bonded package structure and comprises a second packaging substrate 30 and a third semiconductor chip 31 mounted thereon and electrically connected thereto via a plurality of metal wires 32. The third semiconductor chip 31 and the metal wires 32 are encapsulated with an encapsulant 33. The metal wires 32 are bound to a plurality of contact pads 37 provided on the second packaging substrate 30, and the contact pads 37 are electrically connected to the fifth conductive pads 35 via a built-in circuit layer (not shown).

Figure 3B:
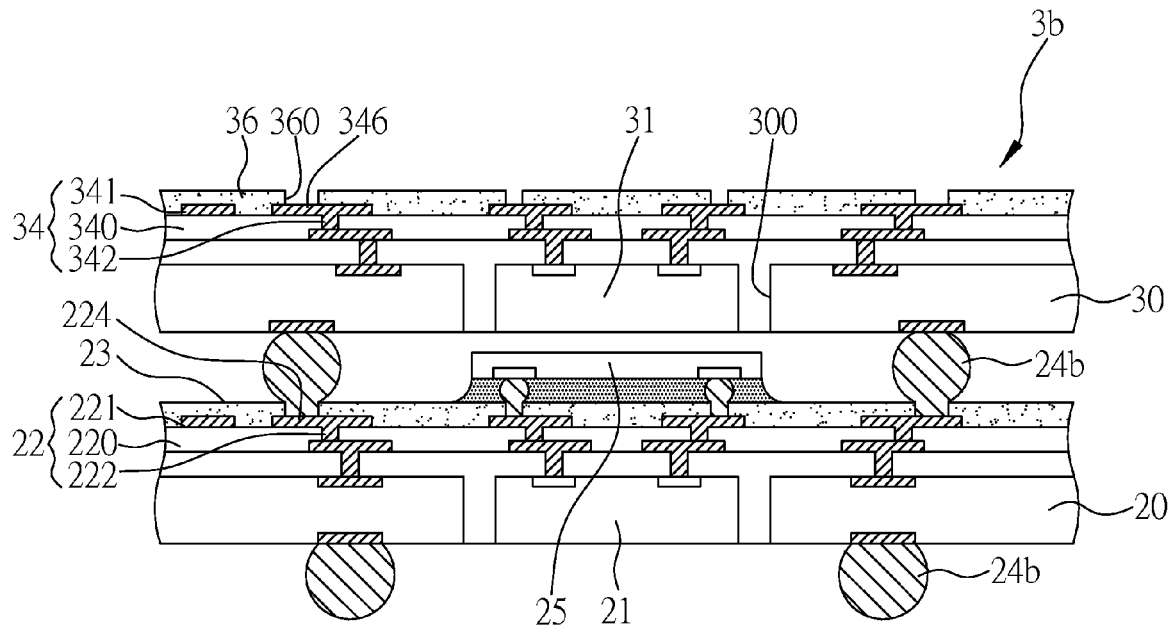
FIG. 3B is a cross-sectional view showing a semiconductor package structure mounted in another stacked structure according to the present invention.

Referring to FIG. 3B, alternatively, the stacked structure 3b is a chip-embedded package structure which comprises the second packaging substrate 30 with a second cavity 300 formed therein, and a third semiconductor chip 31 received in the second cavity 300. At least one second build-up circuit structures 34 are formed on the second packaging substrate 30 and third semiconductor chip 31. The second build-up circuit structures 34 each comprises a dielectric layer 340, a circuit layer 341 superimposed on the dielectric layer 340, and a plurality of conductive vias 342 formed in the dielectric layer 340 and electrically connected to the circuit layer 341. A plurality of sixth conductive pads 346 are formed on the second build-up circuit structures 34 and electrically connected to the circuit layer 341. Portions of the conductive vias 342 are electrically connected to the second packaging substrate 30 and the third semiconductor chip 31. A second insulating protective layer 36 is formed on the second build-up circuit structures 34. A plurality of openings 360 are formed in the second insulating protective layer 36 so as to expose the sixth conductive pads 346 on the second build-up circuit structures 34. Another electronic device can be mounted on the sixth conductive pads 346 exposed from the openings 360. A plurality of first and second conductive pads are provided on the two opposing surfaces of the second packaging substrate 30 respectively, just like the plurality of first and second conductive pads 201, 202 provided on the two opposing surfaces of the first packaging substrate 20 shown in FIG. 2A. The first and second conductive pads provided on the two opposing surfaces of the second packaging substrate 30 can be electrically connected to one another by a built-in circuit layer (not shown) of the second packaging substrate 30.

Figure 3C:
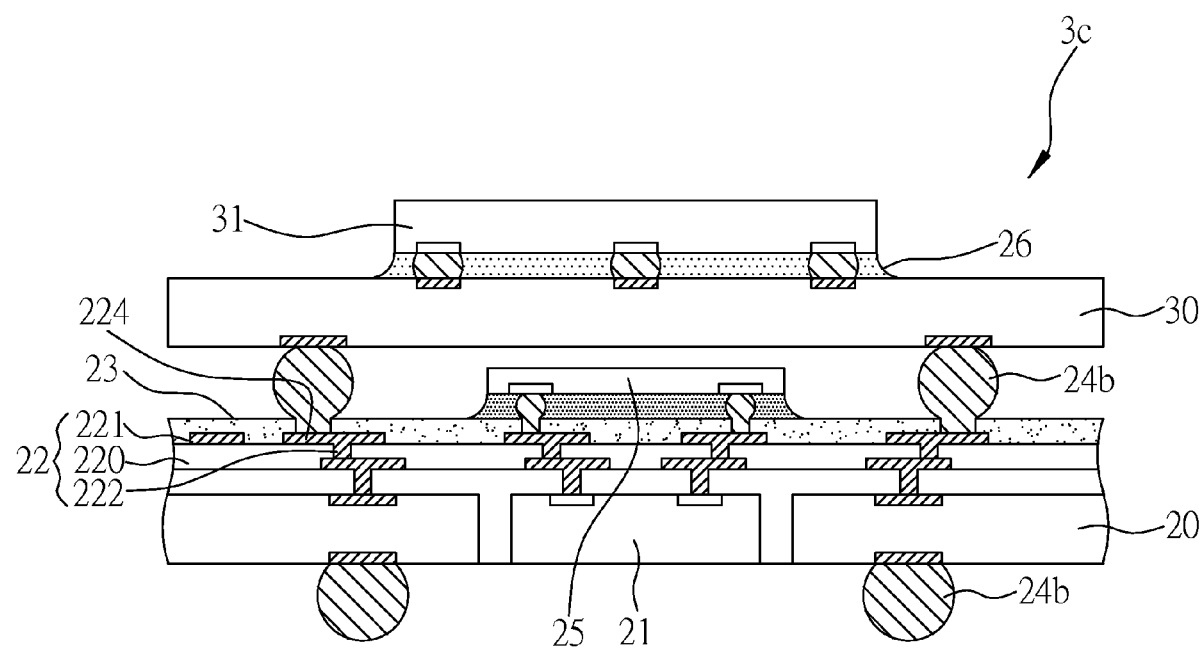
FIG. 3C is a cross-sectional view showing a semiconductor package structure mounted in yet another stacked structure according to the present invention.

Referring to FIG. 3C, alternatively, the stacked structure 3c is a flip-chip package structure which comprises the second packaging substrate 30 and the third semiconductor chip 31 electrically connected to the second packaging substrate 30 by a flip-chip method. An underfill material 26 is filled between the third semiconductor chip 31 and the second packaging substrate 30. A plurality of first and second conductive pads are provided on the two opposing surfaces of the second packaging substrate 30 respectively, just like the plurality of first and second conductive pads 201, 202 provided on the two opposing surfaces of the first packaging substrate 20 shown in FIG. 2A. The first and second conductive pads provided on the two opposing surfaces of the second packaging substrate 30 can be electrically connected to one another by a built-in circuit layer (not shown) of the second packaging substrate 30.

A semiconductor package structure of the present invention comprises: a first packaging substrate 20 having a first surface 20a with a plurality of first conductive pads 201 formed thereon, an opposing second surface 20b with a plurality of second conductive pads 202 formed thereon, and at least a first cavity 200 formed through the first surface 20a and the second surface 20b; a first semiconductor chip 21 received in the first cavity 200 and having an active surface 21a with a plurality of first electrode pads 211 formed thereon and an opposing inactive surface 21b; at least one first build-up circuit structures 22 formed on the first surface 20a of the first packaging substrate 20 and the active surface 21a of the first semiconductor chip 21, wherein each of the first build-up circuit structures 22 comprises a dielectric layer 220, a circuit layer 221 superimposed on the dielectric layer 220, and a plurality of conductive vias 222 formed in the dielectric layer 220 and electrically connected to the circuit layer 221, wherein the conductive vias 222 are electrically connected to the first conductive pads 201 of the first packaging substrate 20 and the first electrode pads 211 of the first semiconductor chip 21, and a plurality of third and fourth conductive pads 223, 224 electrically connected to the circuit layer are provided on the first build-up circuit structures 22, allowing a plurality of openings 230 to be formed in a first insulating protective layer 23 formed on the first build-up circuit structures 22 such that the third and fourth conductive pads 223, 224 of the first build-up circuit structures 22 are exposed from the openings 230; a second semiconductor component 25 provided with a plurality of second electrode pads 252 and mounted on the third conductive pads 223 of the first build-up circuit structures 22 via a plurality of first conductive elements 24a in the form of solder bumps; and an underfill material 26 provided between the second semiconductor component 25 and the first insulating protective layer 23.

The present invention further provides another semiconductor package structure which comprises a first packaging substrate 20, a semiconductor device 2, at least one first build-up circuit structures 22, 22', a second semiconductor component 25, and an underfill material 26. The first packaging substrate 20 has a first surface 20a with a plurality of first conductive pads 201 formed thereon, an opposing second surface 20b with a plurality of second conductive pads 202 formed thereon, and at least a first cavity 200 formed through the first surface 20a and the second surface 20b. The semiconductor device 2 is received in the first cavity 200 and comprises first and second semiconductor chips 21, 21' with inactive surfaces 21b, 21b' bound with one another by a binder 21c, allowing active surfaces 21a, 21a' of the first and second semiconductor chips 21, 21' to be exposed and provided with first and second electrode pads 211, 211'. The first build-up circuit structures 22 are formed on the first surface 20a of the first packaging substrate 20 and the active surface 21a of the first semiconductor chip 21. The first build-up circuit structures 22' are formed on the second surface 20b of the first packaging substrate 20 and the active surface 21a' of the second semiconductor chip 21' of the semiconductor device 2. The first build-up circuit structures 22, 22' each comprise a dielectric layer 220, a circuit layer 221 superimposed on the dielectric layer 220, and a plurality of conductive vias 222 formed in the dielectric layer 220 and electrically connected to the circuit layer 221. The conductive vias 222 are electrically connected to the first conductive pads 201 of the first packaging substrate 20 and the first electrode pads 211 of the first semiconductor chip 21. A plurality of third and fourth conductive pads 223, 224 electrically connected to the circuit layer 221 are formed on the first build-up circuit structures 22. A first insulating protective layer 23 is formed on the first build-up circuit structures 22. A plurality of openings 230 are formed in the first insulating protective layer 23, allowing the third and fourth conductive pads 223, 224 of the first build-up circuit structures 22 to be exposed from the openings 230. The second semiconductor component 25 is provided with a plurality of second electrode pads 252 and mounted on the third conductive pads 223 on the first build-up circuit structures 22 via the first conductive elements 24a in the form of solder bumps. The underfill material 26 is provided between the second semiconductor component 25 and the first insulating protective layer 23.

The semiconductor package structure of the present invention further comprises a plurality of second conductive elements formed on the second conductive pads 202 of the first packaging substrate 20 and the fourth conductive pads 224 of the first build-up circuit structures 22, and the second conductive elements are solder balls 24b, as shown in FIG. 2E; alternatively, the second conductive elements, provided in the form of pin 24b', are formed on the second conductive pads 202 of the first packaging substrate 20, and the second conductive elements, provided in the form of solder balls 24b, are formed on the fourth conductive pads 224 of the first build-up circuit structures 22, as shown in FIG. 2E'. A stacked structure 3a, 3b, 3c provided with a plurality of fifth conductive pads 35 is mounted on the solder balls 24b on the fourth conductive pads 224 and thereby electrically connected to the first build-up circuit structures 22 on the first packaging substrate 20.

The stacked structure 3a comprises a second packaging substrate 30 and a third semiconductor chip 31 mounted thereon. The third semiconductor chip 31 is electrically connected to the second packaging substrate 30 by a plurality of metal wires 32, and the third semiconductor chip 31, together with the metal wires 32, is encapsulated with an encapsulant 33, as shown in FIG. 3A. Alternatively, the stacked structure 3b comprises a second packaging substrate 30 with a second cavity 300 formed therein and the third semiconductor chip 31 received in the second cavity 300; and at least one second build-up circuit structures 34 are formed on the second packaging substrate 30 and the third semiconductor chip 31. The second build-up circuit structures 34 each comprises a dielectric layer 340, a circuit layer 341 superimposed on the dielectric layer 340, and a plurality of conductive vias 342 formed in the dielectric layer 340 and electrically connected to the circuit layer 341. A plurality of sixth conductive pads 346 are formed on the second build-up circuit structures 34 and electrically connected to the circuit layer 341. The conductive vias 342 are electrically connected to the second packaging substrate 30 and third semiconductor chip 31. A second insulating protective layer 36 is formed on the second build-up circuit structures 34. A plurality of openings 360 are formed in the second insulating protective layer 36, allowing the sixth conductive pads 346 on the second build-up circuit structures 34 to be exposed from the openings 360, as shown in FIG. 3B. Alternatively, the stacked structure 3c comprises the second packaging substrate 30 and the third semiconductor chip 31 electrically connected to the second packaging substrate 30 by a flip-chip method. An underfill material 26 is provided between the third semiconductor chip 31 and the second packaging substrate 30 as shown in FIG. 3C.

The present invention provides a semiconductor package structure. A first semiconductor component, such as a semiconductor chip, is embedded in a first packaging substrate so to reduce the height of package. A second semiconductor component is electrically connected to at least one first build-up circuit structures on the first packaging substrate so as to enhance electrical functions. Another stacked electronic device is mounted on the first packaging substrate so as to enhance electrical functionality and expandability.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package structure, comprising:
a first packaging substrate having a first surface, a second surface, and at least a first cavity penetrating through the first surface and the second surface, wherein the first surface and the second surface have a plurality of first and second conductive pads, respectively, formed thereon;
a first semiconductor component having at least an active surface on which a plurality of first electrode pads are disposed, wherein the first semiconductor component is disposed in the first cavity;
a first build-up circuit structure comprising a plurality of third and fourth conductive pads, and a plurality of conductive vias for electrically connecting to the first conductive pads of the first packaging substrate and the first electrode pads of the first semiconductor component, wherein the first build-up circuit structure is disposed on the first surface of the first packaging substrate and the active surface of the first semiconductor component;
a second semiconductor component comprising a plurality of second electrode pads, wherein the second semiconductor component is disposed on surfaces of the third conductive pads of the first build-up circuit by a plurality of first conductive elements;
a plurality of second conductive elements disposed on the fourth conductive pads of the first build-up circuit structure of the first packaging substrate; and
a stacked structure comprising a plurality of fifth conductive pads, wherein the fifth conductive pads correspond to the second conductive elements disposed on the surfaces of the fourth conductive pads, so as to electrically connect the stacked structure to the first build-up circuit structure disposed on the first packaging substrate.

2. The semiconductor package structure of claim 1, wherein the first semiconductor component is a first semiconductor chip having an active surface and an inactive surface.

3. The semiconductor package structure of claim 1, wherein the first semiconductor component is a semiconductor device comprising a first semiconductor chip and a second semiconductor chip, the first and second semiconductor chips each has an active surface and a inactive surface, the active surfaces of the first and second semiconductor chips each comprises a plurality of first and second electrode pads, respectively, and the first and the second semiconductor chips are connected to each other by the inactive surfaces with a binding material.

4. The semiconductor package structure of claim 3, wherein the second surface of the first packaging substrate forms another first build-up circuit structure with the active surface of the second semiconductor chip, and a plurality of conductive vias in the another first build-up circuit structure are electrically connected to the second electrode pads and the second conductive pads of the first packaging substrate.

5. The semiconductor package structure of claim 1, wherein the first conductive elements are solder bumps and the second conductive elements are solder balls.

6. The semiconductor package structure of claim 1, wherein each of the second conductive pads of the first packaging substrate further comprises a second conductive element disposed on a surface thereof.

7. The semiconductor package structure of claim 6, wherein the second conductive element is one of a solder ball and a pin.

8. The semiconductor package structure of claim 1, wherein the stacked structure comprises a second packaging substrate and a third semiconductor chip, wherein the third semiconductor chip is disposed on a surface of the second packaging substrate, the third semiconductor chip is electrically connected to the second packaging substrate by metal wirings, and an encapsulant encapsulates the third semiconductor chip and the metal wirings.

9. The semiconductor package structure of claim 1, wherein the stacked structure comprises a second packaging substrate and a third semiconductor chip, wherein the second packaging substrate has a second cavity, the third semiconductor chip is disposed in the second cavity, a second build-up circuit structure is formed on a surface of the second packaging substrate and a surface of the third semiconductor chip, and the second build-up circuit structure has a plurality of conductive vias for electrically connecting to the second packaging substrate and the third semiconductor chip.

10. The semiconductor package structure of claim 9, wherein the second build-up circuit structure comprises a dielectric layer, a circuit layer disposed on the dielectric layer, a plurality of conductive vias formed in the dielectric layer, and a plurality of sixth conductive pads disposed on a surface of the second build-up circuit structure, wherein the conductive vias are used for electrically connecting to the circuit layer.

11. The semiconductor package structure of claim 10, wherein the second build-up circuit structure further comprises a second insulating protective layer disposed on a surface of the circuit layer, wherein the second insulating protective layer has a plurality of openings formed thereon, so as to expose the sixth conductive pads of the second build-up circuit structure by the openings.

12. The semiconductor package structure of claim 1, wherein the stacked structure is formed by electrically connecting a second packaging substrate to a third semiconductor chip of the second packaging substrate by a flip-chip method, and disposing an underfill material between the third semiconductor chip and the second packaging substrate.

13. The semiconductor package structure of claim 1, wherein the first build-up circuit structure comprises a dielectric layer, a circuit layer disposed on the dielectric layer, and a plurality of conductive vias disposed in the dielectric layer, wherein the conductive vias are used for electrically connecting to the circuit layer, and wherein the third and the fourth conductive pads are electrically connecting to the circuit layer.

14. The semiconductor package structure of claim 4, wherein the first build-up circuit structure comprises a dielectric layer, a circuit layer disposed on the dielectric layer, and a plurality of conductive vias disposed in the dielectric layer, wherein the conductive vias are used for electrically connecting to the circuit layer, and wherein the third and the fourth conductive pads are electrically connecting to the circuit layer.

15. The semiconductor package structure of claim 1, wherein the dielectric layer is formed on the first surface of the first packaging substrate and the active surface of the first semiconductor component, and the dielectric layer is disposed in a gap between the first semiconductor component and the first cavity, so as to fix the first semiconductor component in position in the first cavity.

16. The semiconductor package structure of claim 1, wherein an adhesive material is disposed in a gap between the first semiconductor component and the first cavity, so as to fix the first semiconductor component in position in the first cavity.

17. The semiconductor package structure of claim 1, wherein the first build-up circuit structure further comprises a first insulating protective layer disposed on a surface of the first build-up circuit structure, wherein the first insulating protective layer has a plurality of openings formed thereon, so as to expose the third and the fourth conductive pads of the first build-up circuit structure.

18. The semiconductor package structure of claim 4, wherein the first build-up circuit structure further comprises a first insulating protective layer disposed on a surface of the another first build-up circuit structure, wherein the first insulating protective layer has a plurality of openings formed thereon, so as to expose the third and the fourth conductive pads of the first build-up circuit structure.

19. The semiconductor package structure of claim 17, further comprises an underfill material disposed between a surface of the second semiconductor component and a surface of the first insulating protective layer.

20. The semiconductor package structure of claim 18, further comprises an underfill material disposed between a surface of the second semiconductor component and a surface of the first insulating protective layer.

* * * * *